United States Patent
Onaga et al.

(10) Patent No.: US 11,521,913 B2
(45) Date of Patent: Dec. 6, 2022

(54) POWER CONVERSION APPARATUS

(71) Applicant: Panasonic Intellectual Property Management Co., Ltd., Osaka (JP)

(72) Inventors: Hayata Onaga, Kanagawa (JP); Tomonari Nebashi, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/306,667

(22) Filed: May 3, 2021

(65) Prior Publication Data

US 2021/0257276 A1   Aug. 19, 2021

Related U.S. Application Data

(63) Continuation of application No. 16/359,861, filed on Mar. 20, 2019, now Pat. No. 11,037,859.

(30) Foreign Application Priority Data

Mar. 27, 2018   (JP) .............................. JP2018-060312

(51) Int. Cl.
*G06F 1/16* (2006.01)
*H05K 5/00* (2006.01)
*H05K 7/00* (2006.01)
*H01L 23/42* (2006.01)
*G01R 15/20* (2006.01)
*G01R 19/00* (2006.01)
(Continued)

(52) U.S. Cl.
CPC ............ *H01L 23/42* (2013.01); *G01R 15/207* (2013.01); *G01R 19/0092* (2013.01); *H01L 23/142* (2013.01); *H01L 23/4006* (2013.01); *H01L 23/552* (2013.01); *H01L 25/18* (2013.01); *H02M 1/08* (2013.01); *H02M 7/003* (2013.01); *H05K 7/1432* (2013.01); *H05K 7/209* (2013.01); *H05K 9/00* (2013.01); *H01L 2023/4087* (2013.01); *H02M 1/0009* (2021.05)

(58) Field of Classification Search
CPC .... H05K 7/1432; H05K 7/209; H05K 7/2089; H05K 7/20909; H05K 7/20945; H01L 23/42; H01L 23/142; H01L 23/4006; H01L 23/552; H01L 23/427; H01L 23/4275; H01L 23/40; H01L 23/4018; H01L 23/4037; H01L 23/4075; G01R 15/207; G01R 19/0092
See application file for complete search history.

(56) References Cited

U.S. PATENT DOCUMENTS 6,888,729 B2 * 5/2005 Maekawa ............ H05K 7/1432
363/56.02
9,295,184 B2 * 3/2016 Korich ................... H05K 7/209
(Continued)

FOREIGN PATENT DOCUMENTS

JP   2003-125588 A   4/2003

*Primary Examiner* — Anthony M Haughton
(74) *Attorney, Agent, or Firm* — Seed IP Law Group LLP

(57) ABSTRACT

To improve cooling capability, power conversion apparatus 1 that converts a direct current voltage into an alternating current voltage includes: first substrate 100 on which power conversion circuit 2 is mounted; second substrate 200 on which driving circuit 3 that drives power conversion circuit 2 is mounted; and shield plate 300 that is disposed between first substrate 100 and second substrate 200, and first substrate 100 is a metal substrate.

19 Claims, 17 Drawing Sheets

(51) Int. Cl.
　　　*H01L 23/14*　　　(2006.01)
　　　*H01L 23/40*　　　(2006.01)
　　　*H01L 23/552*　　(2006.01)
　　　*H01L 25/18*　　　(2006.01)
　　　*H02M 1/08*　　　(2006.01)
　　　*H02M 7/00*　　　(2006.01)
　　　*H05K 7/20*　　　(2006.01)
　　　*H05K 9/00*　　　(2006.01)
　　　*H05K 7/14*　　　(2006.01)
　　　*H02M 1/00*　　　(2006.01)

(56) References Cited

U.S. PATENT DOCUMENTS

| | | | |
|---|---|---|---|
| 10,003,274 B2 * | 6/2018 | Takahashi | H05K 9/002 |
| 2003/0072117 A1 * | 4/2003 | Maekawa | H05K 7/1432 |
| | | | 361/86 |
| 2010/0025126 A1 * | 2/2010 | Nakatsu | B60L 50/00 |
| | | | 361/699 |
| 2012/0275205 A1 * | 11/2012 | Nakatsu | H05K 7/209 |
| | | | 363/141 |
| 2013/0265811 A1 * | 10/2013 | Shiomi | H02M 7/003 |
| | | | 363/146 |
| 2016/0181940 A1 * | 6/2016 | Takahashi | H05K 7/1432 |
| | | | 361/752 |
| 2017/0170736 A1 * | 6/2017 | Hirashima | H02M 3/33507 |
| 2017/0194872 A1 * | 7/2017 | Fukumasu | H05K 5/04 |
| 2017/0353118 A1 * | 12/2017 | Hara | H05K 7/1432 |
| 2019/0098777 A1 * | 3/2019 | Nakatsu | H01L 23/642 |

* cited by examiner

POWER CONVERSION APPARATUS

TECHNICAL FIELD

The present disclosure relates to a power conversion apparatus.

BACKGROUND ART

There is a conventionally known power conversion apparatus that modularizes a substrate on which power conversion semiconductor elements are mounted, and a substrate on which a driving/protecting section that drives and protects the power conversion semiconductor elements, and an electric power source circuit that supplies an electric power to the driving/protecting section are mounted.

CITATION LIST

Patent Literature

PTL 1

JP 2003-125588 A

SUMMARY OF INVENTION

Technical Problem

However, the power conversion apparatus disclosed in Patent Literature 1 has a problem that it is not possible to sufficiently dissipate heat generated by the power conversion semiconductor elements, the driving/protecting section and the electric power source circuit.

An object of the present disclosure is to provide a power conversion apparatus that can improve cooling capability.

Solution to Problem

One embodiment of the present disclosure is a power conversion apparatus that converts a direct current voltage into an alternating current voltage, the power conversion apparatus including: a first substrate on which a power conversion circuit is mounted; a second substrate on which a driving circuit that drives the power conversion circuit is mounted; and a shield plate that is disposed between the first substrate and the second substrate, wherein the first substrate is a metal substrate.

Advantageous Effects of Invention

According to the present disclosure, it is possible to improve cooling capability.

DESCRIPTION OF EMBODIMENTS

Hereinafter, power conversion apparatus 1 according to an embodiment of the present disclosure will be described in detail with reference to the drawings. In this regard, the embodiment described below is an example, and the present disclosure is not limited by this embodiment.

In FIGS. 1A to 12, a Cartesian coordinate system formed by an X axis, a Y axis and a Z axis is drawn for ease of description. A positive direction of the X axis is defined as a +X direction, a positive direction of the Y axis is defined as a +Y direction and a positive direction of the Z axis is defined as a +Z direction (upper direction). In addition, the X axis, the Y axis and the Z axis shown in each drawing indicate each direction in the Cartesian coordinate system, and do not accurately indicate a position (coordinate) of each part in the Cartesian coordinate system.

(Overall Configuration of Power Conversion Apparatus 1)

Figure 1A:
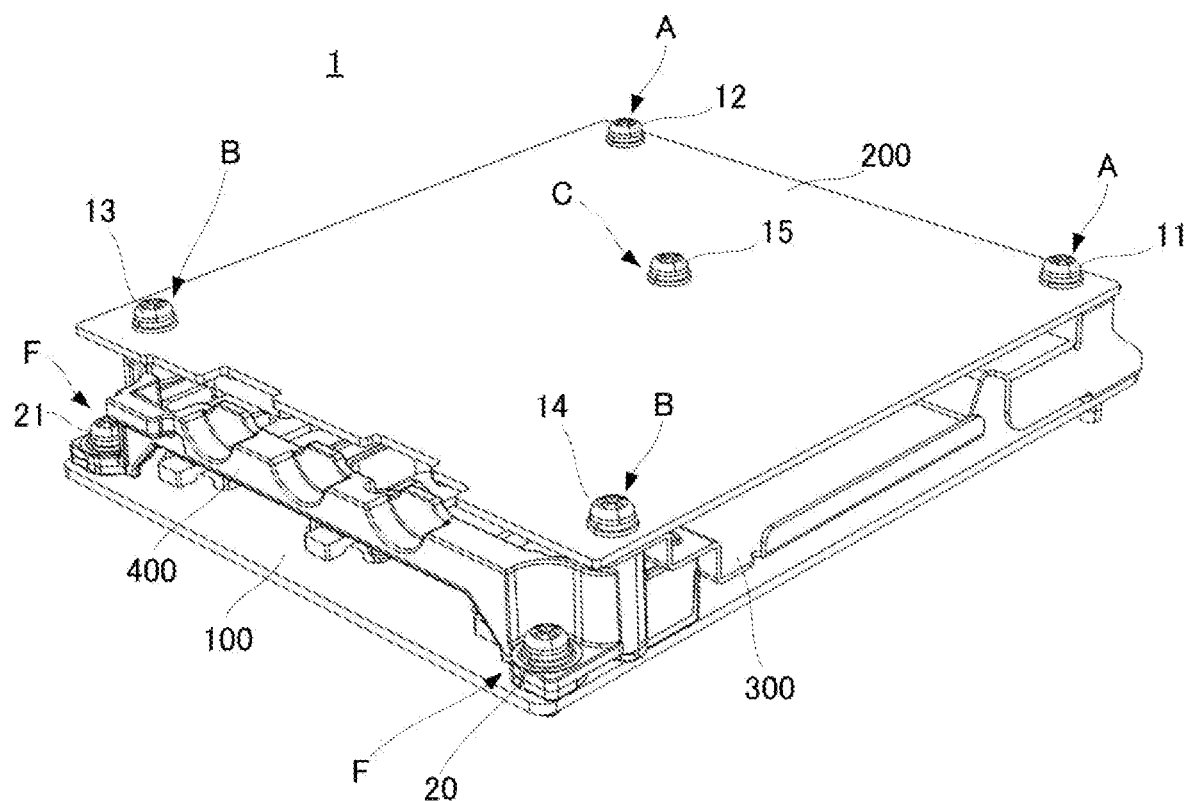
FIG. 1A is a perspective view showing an overall configuration of a power conversion apparatus.
Figure 1A:
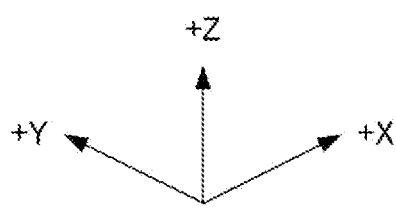
Figure 1B:
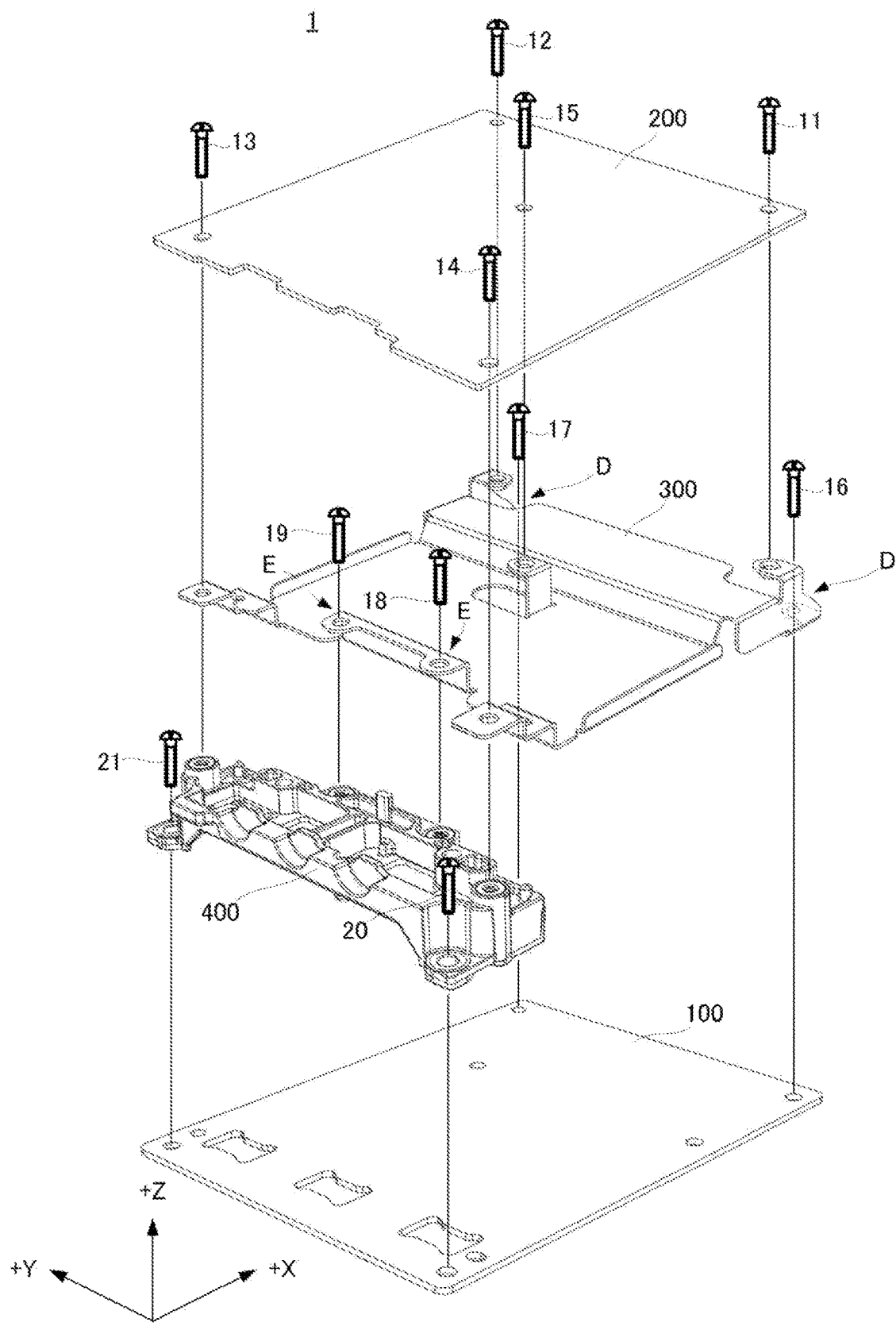
FIG. 1B is an exploded perspective view showing the overall configuration of the power conversion apparatus.
Figure 2:
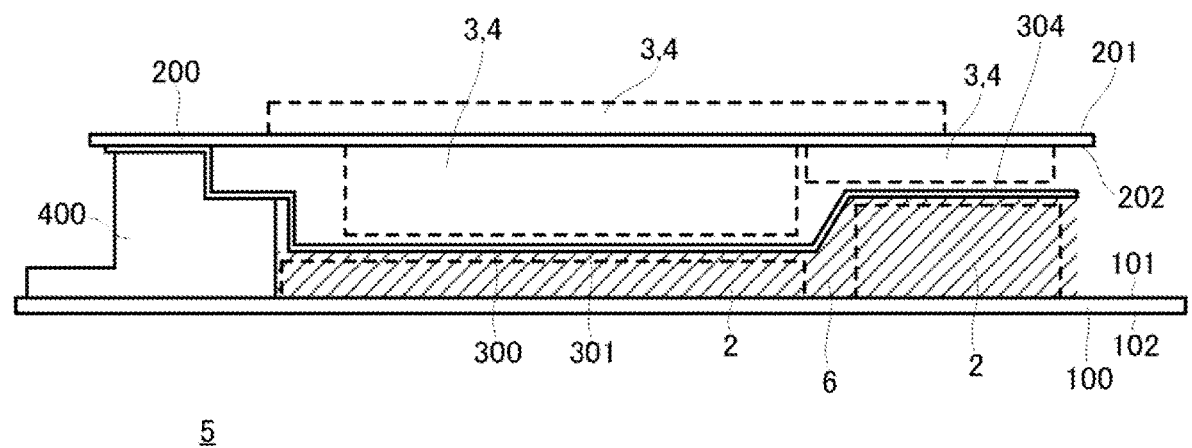
FIG. 2 is a cross-sectional view showing an internal configuration of the power conversion apparatus.
Figure 2:
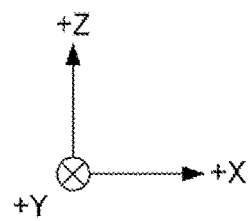

The overall configuration of power conversion apparatus 1 will be described with reference to FIGS. 1A, 1B and 2. FIG. 1A is a perspective view showing an overall configuration of power conversion apparatus 1. FIG. 1B is an exploded perspective view showing the entire configuration of power conversion apparatus 1. FIG. 2 is a cross-sectional view showing an internal configuration of power conversion apparatus 1. FIG. 2 shows a cross section that is parallel to a ZX plane. FIGS. 1A, 1B and 2 omit part of parts if necessary for ease of understanding.

Power conversion apparatus 1 is an apparatus that is mounted on a vehicle such as an electric vehicle, and converts direct current power from a battery into an alternating current power, and outputs the alternating current to a motor. The battery is, for example, a lithium ion battery. The motor is, for example, a three-phase alternating current motor.

Power conversion apparatus 1 includes power conversion circuit 2, driving circuit 3 and electric power source circuit 4. Electric power source circuit 4 supplies power to driving circuit 3. Driving circuit 3 generates a switching signal by the power supplied from electric power source circuit 4. Furthermore, according to the switching signal generated by driving circuit 3, a plurality of power conversion semiconductor elements of power conversion circuit 2 is driven. Thus, the direct current power is converted into the alternating current power.

Power conversion apparatus 1 includes first substrate 100, second substrate 200, shield plate 300 and sensor module 400. Power conversion apparatus 1 adopts a multilayer structure that first substrate 100 and second substrate 200 are aligned in an upper and lower direction (Z direction) and disposed.

First substrate 100 is placed at a bottom portion of housing 5 in which power conversion apparatus 1 is housed. A plurality of power conversion semiconductor elements of power conversion circuit 2 is mounted on upper surface 101 of first substrate 100. That is, power conversion circuit 2 is mounted on first substrate 100.

Second substrate 200 is disposed on an upper side of first substrate 100 and with a gap from first substrate 100. Components of driving circuit 3 and electric power source circuit 4 are mounted on upper surface 201 and lower surface 202 of first substrate 200. That is, driving circuit 3 and electric power source circuit 4 are mounted on both surfaces of second substrate 200. Driving circuit 3 and electric power source circuit 4, and power conversion circuit 2 are electrically connected by using an unshown FFC and FFC connector.

Shield plate 300 is disposed between first substrate 100 and second substrate 200. Shield plate 300 has a function of reducing transmission of electromagnetic noise form first substrate 100 to second substrate 200.

As shown in FIG. 2, shield plate 300 has a stepwise shape including planar portions 301 and 304. Thus, when high height parts such as a capacitor are mounted on upper surface 101 of first substrate 100 and lower surface 202 of second substrate 200, it is possible to suppress the height of power conversion apparatus 1.

More specifically, low height parts of power conversion circuit 2 are disposed on a lower side of planar portion 301, and high height parts of driving circuit 3 and electric power source circuit 4 are disposed on an upper side of planar portion 301. Furthermore, high height parts of power conversion circuit 2 are disposed on a lower side of planar portion 304, and low height parts of driving circuit 3 and electric power source circuit 4 are disposed on an upper side of planar portion 304. Accordingly, it is possible to suppress the height of power conversion apparatus 1.

In the present embodiment, adhesive 6 having heat dissipation properties is filled between shield plate 300 and first substrate 100 (a hatching portion in FIG. 2). Adhesive 6 is, for example, a silicone-based adhesive. Consequently, it is possible to make heat generated by the power conversion semiconductor elements mounted on first substrate 100 escape from first substrate 100 to shield plate 300. Thus, in other words, it is possible to increase a heat capacity of entire power conversion apparatus 1.

By integrating shield plate 300 and first substrate 100 by using adhesive 6, it is possible to raise a natural frequency. By raising the natural frequency, it is possible to prevent a resonance.

Sensor module 400 is disposed adjacent to shield plate 300 in a −X direction side of shield plate 300. In the present embodiment, sensor module 400 is fixed to shield plate 300.

Second substrate 200 is fixed to shield plate 300 by using screw 11 and screw 12 at fixing portions A on a +X end side. Details of fixing portions A will be described in detail below.

Furthermore, second substrate 200 is fixed to shield plate 300 and sensor module 400 by using screw 13 and screw 14 at fixing portions B on a −X end side. Details of fixing portions B will be described in detail below.

Furthermore, second substrate 200 and shield plate 300 are fixed by using screw 15 at fixing portion C formed in a region surrounded by two fixing portions A and two fixing portions B. Details of fixing portion C will be described in detail below.

Shield plate 300 is fixed to first substrate 100 and housing 5 by using screw 16 and screw 17 at fixing portions D on the +X end side. Details of fixing portions D will be described in detail below.

Furthermore, shield plate 300 is fixed to sensor module 400 by using screw 18 and screw 19 at fixing portions E on the −X end side. Details of fixing portions E will be described in detail below.

Sensor module 400 is fixed to first substrate 100 and housing 5 by using screw 20 and screw 21 at fixing portions F on the −X end side. Details of fixing portions F will be described in detail below.

(Configuration of First Substrate 100)

Figure 3:
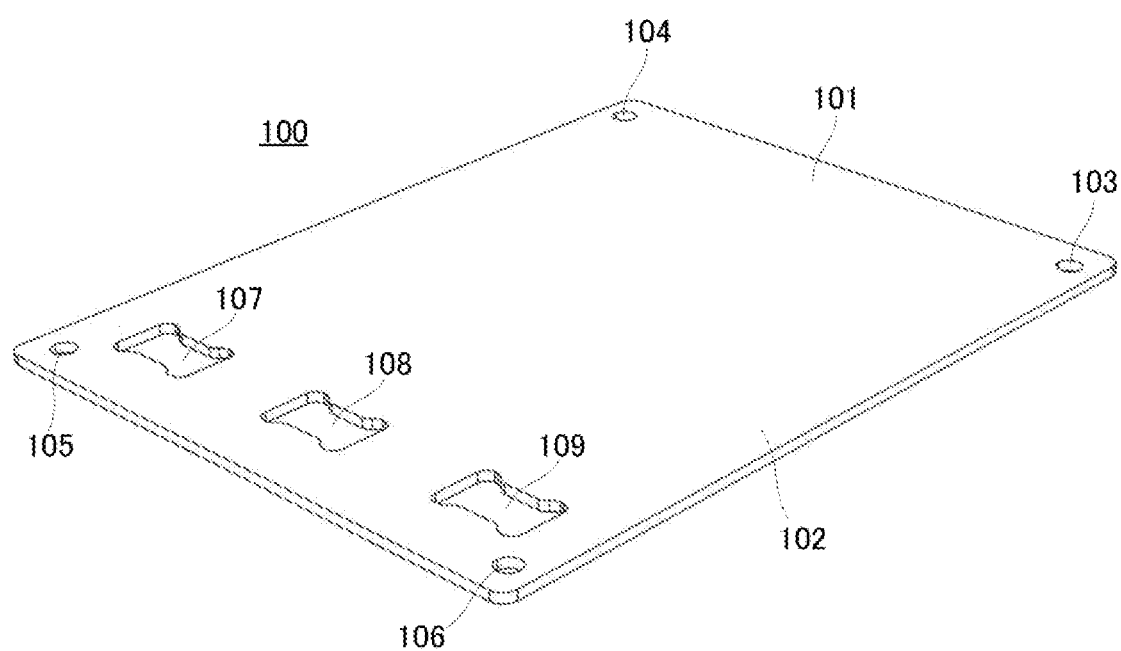
FIG. 3 is a perspective view showing a configuration of a first substrate.
Figure 3:
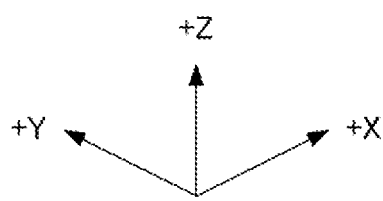

The configuration of first substrate 100 will be described with reference to FIG. 3. FIG. 3 is a perspective view showing the configuration of first substrate 100. First substrate 100 is a thin plate member of a substantially rectangular shape that extends on an XY plane. First substrate 100 is formed by applying an insulation coating made of, for example, an epoxy resin on an aluminum plate that is a base, and forming a wiring pattern on the insulation coating.

In addition, the plate that is the base of first substrate 100 is not limited to the aluminum plate, and various metal plates can be used therefor. Thus, by using a metal material as a material of the plate that is the base of first substrate 100, it is possible to make magnetic noise generated on first substrate 100 escape toward housing 5. Furthermore, by using a material of high magnetic permeability for first substrate 100, an outflow amount of the electromagnetic noise to first substrate 100 increases. Consequently, the total amount of electromagnetic noise flowing out to shield plate 300 decreases, so that it is possible to reduce transmission of the electromagnetic noise to second substrate 200 that is present via shield plate 300.

As described above, a plurality of power conversion semiconductor elements of power conversion circuit 2 is mounted on upper surface 101 of first substrate 100. Lower surface 102 of first substrate 100 is in contact with housing 5. Consequently, it is possible to efficiently cool a plurality of power conversion semiconductor elements of power conversion circuit 2.

Furthermore, each power conversion semiconductor element is formed as a chip part, and therefore has a wide contact area with upper surface 101. Consequently, it is possible to efficiently cool each power conversion semiconductor element.

Furthermore, the thermal grease is filled in the gap caused by fine recesses and protrusions of lower surface 102 of first substrate 100 and fine recesses and protrusions of the bottom portion of housing 5, so that it is possible to further improve cooling efficiency. In addition, first substrate 100 is ground-connected by using an unshown connector.

Hole 103 that penetrates in the Z direction is formed on the +X end side and a −Y end side of first substrate 100. Screw 16 is inserted in hole 103. Hole 104 that penetrates in the Z direction is formed on the +X end side and a +Y end side of first substrate 100. Screw 17 is inserted in hole 104.

Hole 105 that penetrates in the Z direction is formed on the −X end side and the +Y end side of first substrate 100. Screw 21 is inserted in hole 105. Hole 106 that penetrates in the Z direction is formed on the −X end side and the −Y end side of first substrate 100. Screw 20 is inserted in hole 106.

Three holes 107, 108 and 109 that penetrate in the Z direction are aligned from the +Y end side to the −Y end side and formed on the −X end side of first substrate 100. Magnetic elements 51, 52 and 53 (described below) mounted in housing 5 are inserted in holes 107, 108 and 109. Furthermore, current plates 61, 62 and 63 (described below) are disposed crossing holes 107, 108 and 109 in an X direction.

(Configuration of Second Substrate 200)

Figure 4:
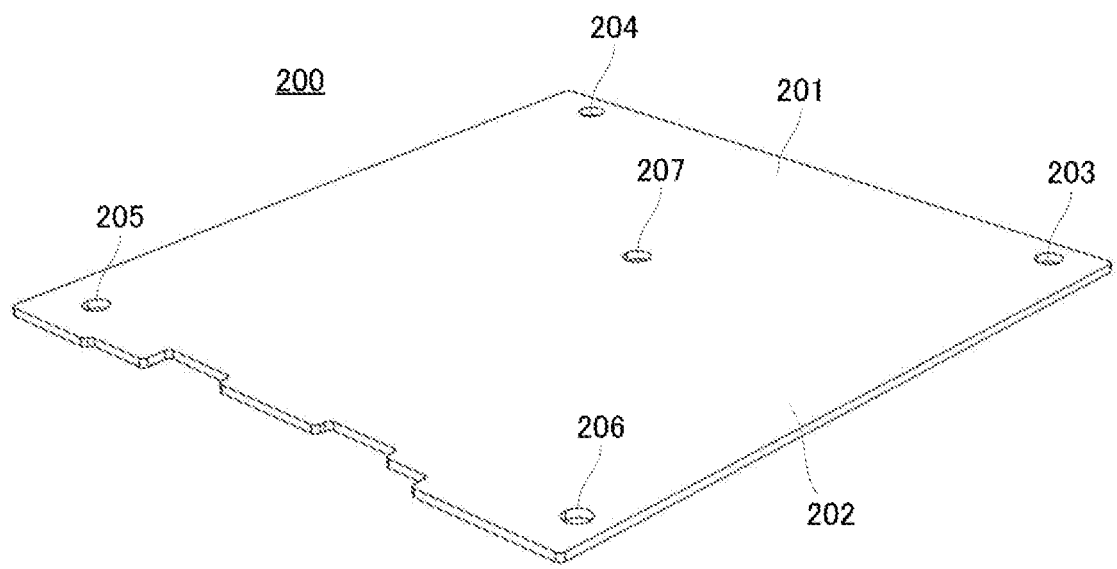
FIG. 4 is a perspective view showing a configuration of a second substrate.
Figure 4:
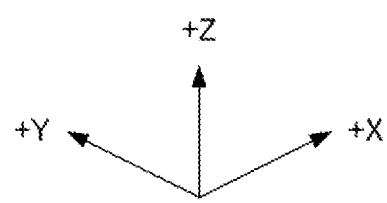

The configuration of second substrate 200 will be described with reference to FIG. 4. FIG. 4 is a perspective view showing the configuration of second substrate 200. Second substrate 200 is a thin plate member of a substantially rectangular shape that extends on the XY plane. Second substrate 200 is formed by forming a wiring pattern on an insulation plate that is the base.

As described above, components of driving circuit 3 and electric power source circuit 4 are mounted on upper surface 201 and lower surface 202 of second substrate 200. Hole 203 that penetrates in the Z direction is formed on the +X end side and the −Y end side of second substrate 200. Screw 11 is inserted in hole 203. Hole 204 that penetrates in the Z direction is formed on the +X end side and the +Y end side of second substrate 200. Screw 12 is inserted in hole 204.

Hole 205 that penetrates in the Z direction is formed on the −X end side and the +Y end side of second substrate 200. Screw 13 is inserted in hole 205. Hole 206 that penetrates in the Z direction is formed on the −X end side and the −Y end side of second substrate 200. Screw 14 is inserted in hole 206.

Hole 207 that penetrates in the Z direction is formed at a center portion of second substrate 200. In other words, hole 207 is formed in a region surrounded by holes 203, 204, 205 and 206 in second substrate 200. Screw 15 is inserted in hole 207.

(Configuration of Shield Plate 300)

Figure 5:
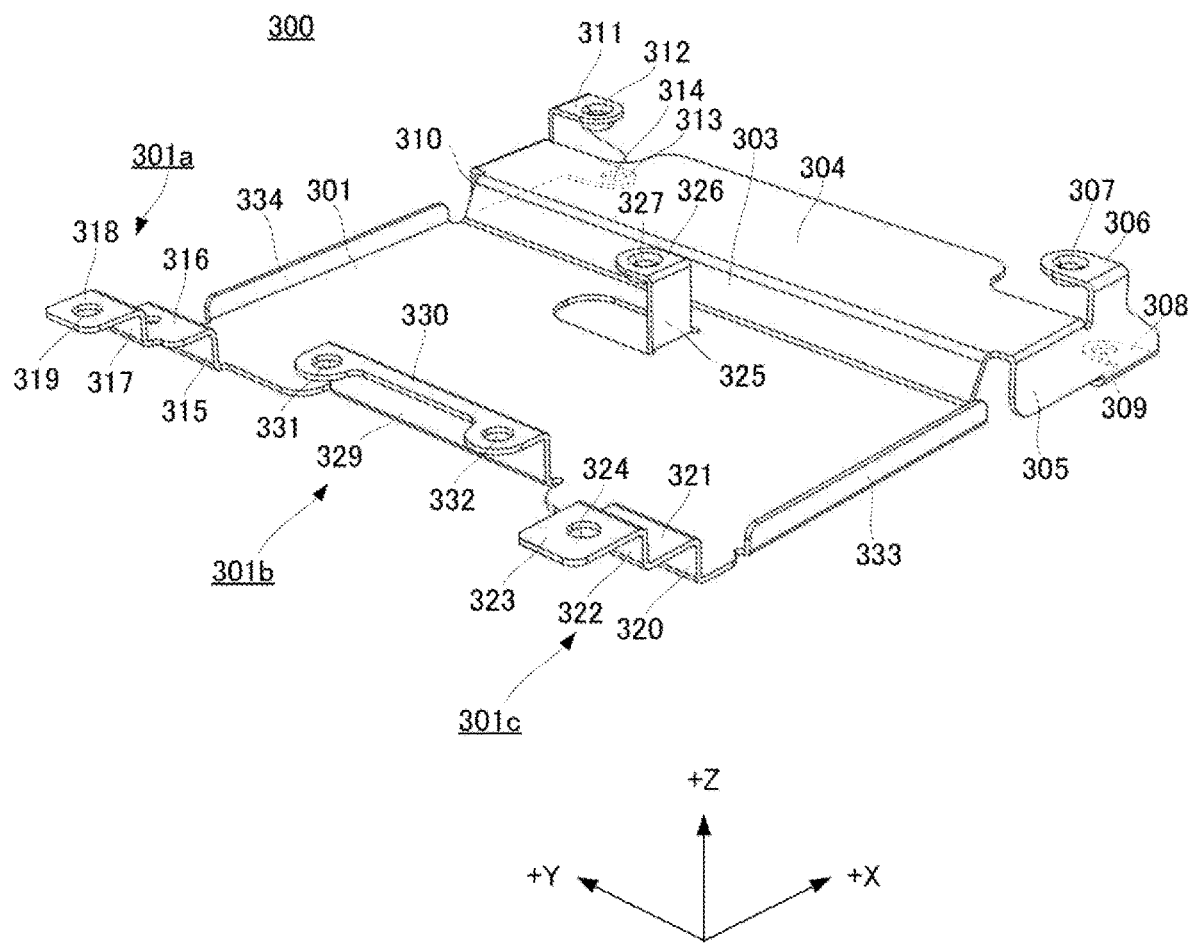
FIG. 5 is a perspective view showing a configuration of a shield plate.

The configuration of shield plate 300 will be described with reference to FIG. 5. FIG. 5 is a perspective view showing the configuration of shield plate 300. Shield plate 300 is a part molded by applying a bending process to a thin plate member made of metal such as an iron-based material. By using the iron-based material for the shield plate, the strength of a portion to which the shield plate is fastened rises, and the portion hardly is fractured. Furthermore, it is possible to reduce the fracture of the portion of a long fastening interval. Most of portions of shield plate 300 extend on the XY plane.

Shield plate 300 includes planar portion 301 that extends on the XY plane, wall portion 303 that extends from the +X end of planar portion 301 in a +Z direction, and planar portion 304 that extends from a +Z end of wall portion 303 in the +X direction.

Wall portion 305 bent from the −Y end of planar portion 304 in a −Z direction extends in the +X direction. Fixing portion 306 that is bent from the +Z end in the +Y direction and extends on the XY plane, and fixing portion 308 that is bent from the +Z end in the +Y direction and extends on the XY plane are formed on the +X end side of wall portion 305.

Fixing portion 306 extends from wall portion 305 in the +Y direction. Screw hole 307 that penetrates in the Z direction is formed at fixing portion 306. Screw 11 is screwed in screw hole 307. Fixing portion 308 extends from wall portion 305 in the +Y direction. Hole 309 that penetrates in the Z direction is formed at fixing portion 308. Screw 16 is inserted in hole 309.

Wall portion 310 that is bent from the +Y end of planar portion 304 in the −Z direction extends in the +X direction. Fixing portion 311 that is bent from the +Z end in a −Y direction and extends on the XY plane, and fixing portion 313 that is bent from the +Z end in the −Y direction and extends on the XY plane are formed on the +X end side of wall portion 310.

Fixing portion 311 extends from wall portion 310 in the −Y direction. Screw hole 312 that penetrates in the Z direction is formed at fixing portion 311. Screw 12 is screwed in screw hole 312. Fixing portion 313 extends from wall portion 310 in the −Y direction. Hole 314 that penetrates in the Z direction is formed at fixing portion 313. Screw 17 is inserted in hole 314.

Fixing portions 301a, 301b and 301c are formed at the −X end of planar portion 301. Fixing portions 301a, 301b and 301c are aligned from the +Y end side to the −Y end side and formed. Fixing portions 301a, 301b and 301c each extend in the −X direction.

Fixing portion 301a includes wall portion 315 that extends from the −X end of planar portion 301 in the +Z direction, planar portion 316 that extends from the +Z end of wall portion 315 in the +X direction, wall portion 317 that extends from the −X end of planar portion 316 in the +Z direction, and planar portion 318 that extends from the +Z end of wall portion 317 in the −X direction. Planar portion 318 extends on the XY plane. Hole 319 that penetrates in the Z direction is formed on planar portion 318. Screw 13 is inserted in hole 319.

Fixing portion 301c includes wall portion 320 that extends from the −X end of planar portion 301 in the +Z direction, planar portion 321 that extends from the +Z end of wall portion 320 in the −X direction, wall portion 322 that extends from the −X end of planar portion 321 in the +Z direction, and planar portion 323 that extends from the +Z end of wall portion 322 in the −X direction. Planar portion 323 extends on the XY plane. Hole 324 that penetrates in the Z direction is formed on planar portion 323. Screw 14 is inserted in hole 324.

Fixing portion 301b includes wall portion 329 that extends from the −X end of planar portion 301 in the +Z direction, and planar portion 330 that extends from the +Z end of wall portion 329 in the −X direction. Planar portion 330 extends on the XY plane. Hole 331 that penetrates in the Z direction is formed on the +Y end side of planar portion 330. Screw 19 is inserted in hole 331. Hole 332 that penetrates in the Z direction is formed on the −Y end side of planar portion 330. Screw 18 is inserted in hole 332.

Wall portion 325 is cut and raised from a center portion of planar portion 301 in the +Z direction. Wall portion 325 extends on the ZX plane. Fixing portion 326 extends from the +Z end of wall portion 325 in the +Y direction. Screw hole 327 that penetrates in the Z direction is formed at fixing portion 326. Screw 17 is screwed in screw hole 327.

In the present embodiment, fixing portions 301a and 301c used to be fixed to second substrate 200 extend in the X direction. On the other hand, fixing portions 308 and 313 used to be fixed to first substrate 100 extend in a Y direction.

By differing extension directions of the fixing portions, it is possible to prevent fracture of the fixing portions of shield plate 300 when vibration transmits from first substrate 100 to second substrate 200 via shield plate 300. In addition, to obtain this effect, all of the fixing portions for first substrate 100 and the fixing portions for second substrate 200 should not extend in the same direction.

In other words, shield plate 300 includes a second substrate side fixing portion that extends in a first direction and is fixed to second substrate 200, and a first substrate side fixing portion that extends in a direction different from the first direction, and is fixed to first substrate 100.

Furthermore, fixing portion 326 is formed in a region surrounded by fixing portion 306, fixing portion 311, planar portion 318 and planar portion 323. Fixing portion 326 has a function of reducing vibration of second substrate 200.

In other words, shield plate 300 includes a plurality of first fixing portions that is fixed to second substrate 200, and a second fixing portion that is formed in a region surrounded by these first fixing portions and is fixed to second substrate 200.

Rib 333 extends from the −Y end of planar portion 301 in the +Z direction. Furthermore, rib 334 extends from the +Y end of planar portion 301 in the +Z direction. Rib 333 and rib 334 have functions of reducing vibration of shield plate 300. Furthermore, rib 333 and rib 334 have functions of reducing deformation of shield plate 300.

(Configuration of Sensor Module 400)

Figure 6A:
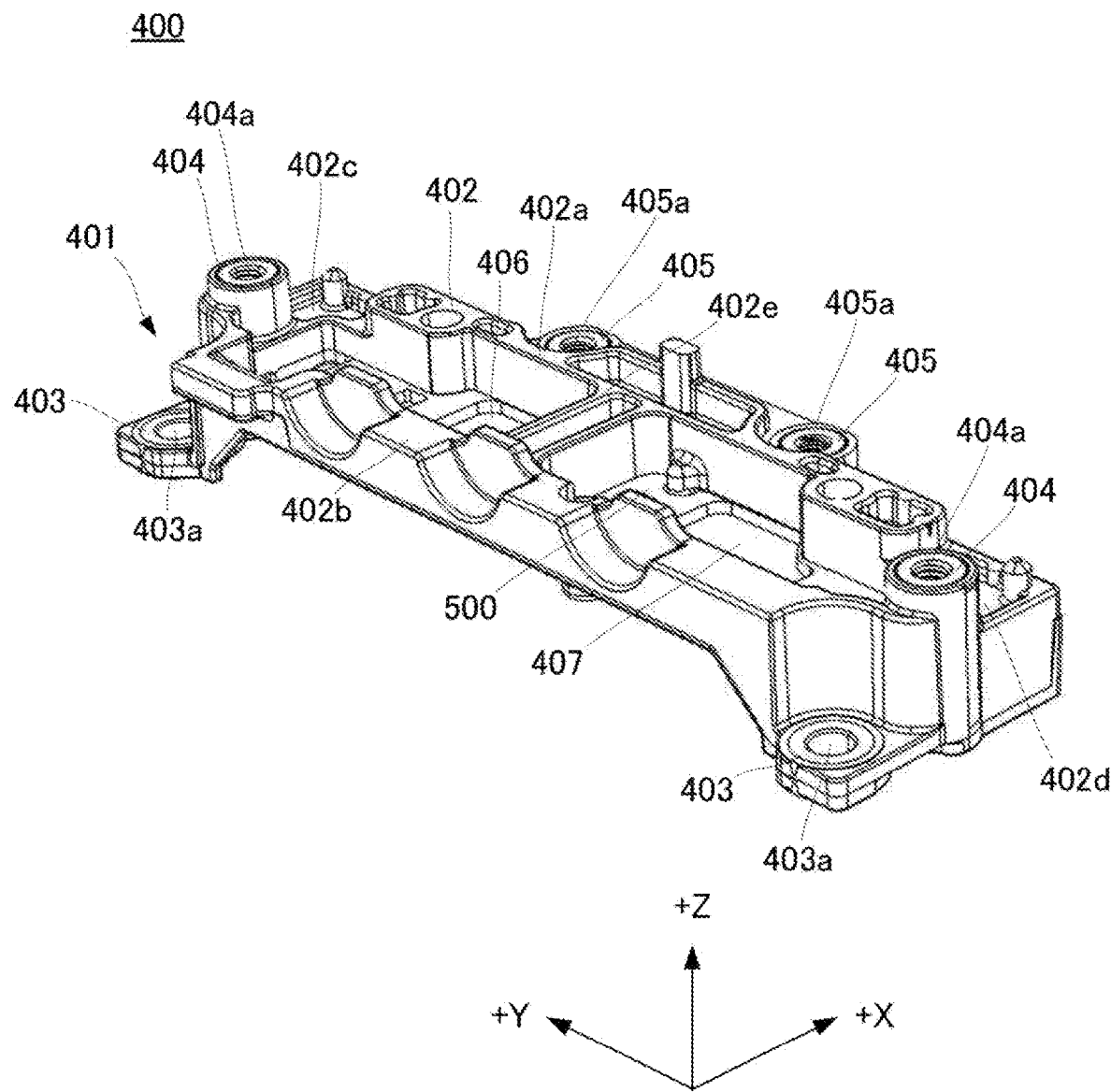
FIG. 6A is a perspective view showing a configuration of a sensor module.
Figure 6B:
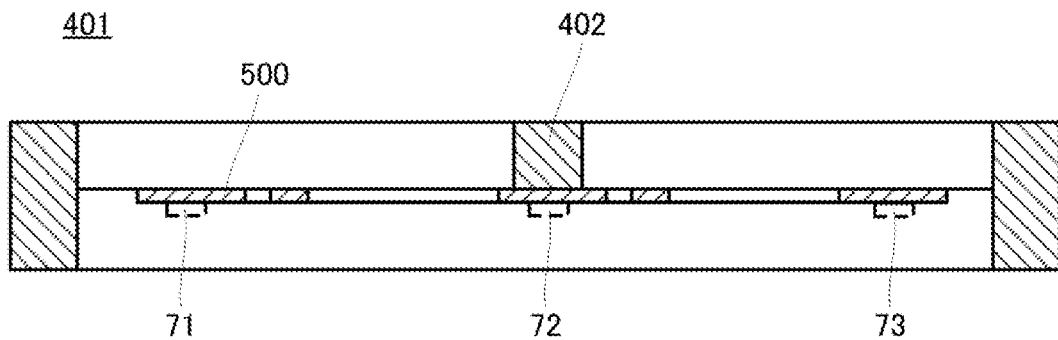
FIG. 6B is a cross-sectional view showing a configuration of the sensor module.
Figure 6B:
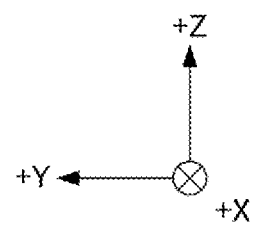
Figure 6C:
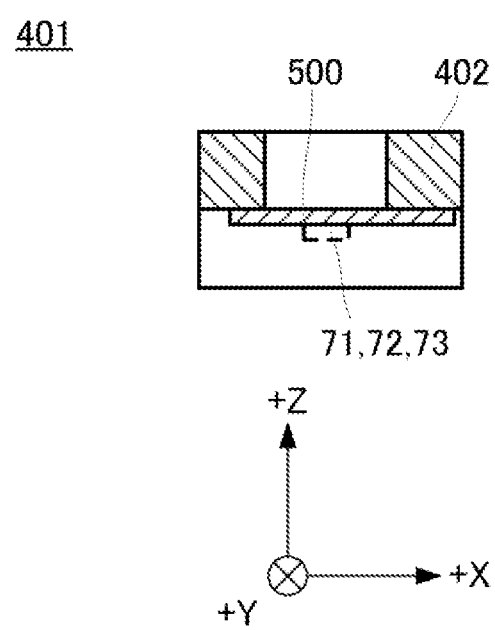
FIG. 6C is a cross-sectional view showing the configuration of the sensor module.
Figure 6D:
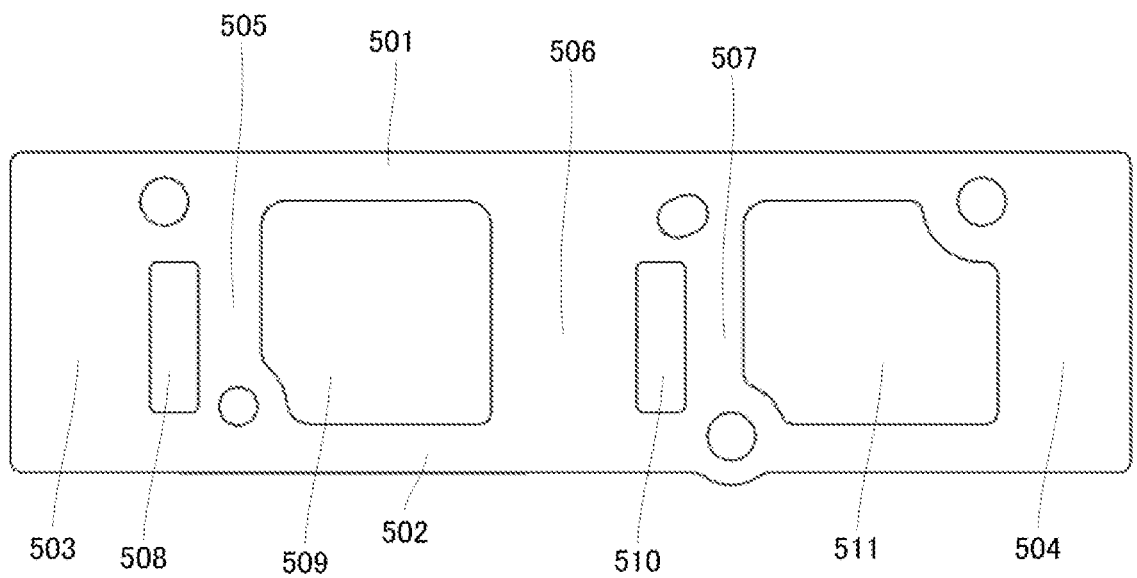
FIG. 6D is a view showing a configuration of a sensor substrate.
Figure 6D:
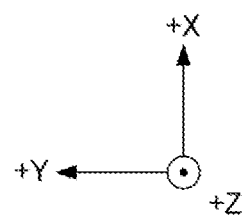

The configuration of sensor module 400 will be described with reference to FIGS. 6A to 6D. FIG. 6A is a perspective view of sensor module 400. FIGS. 6B and 6C are cross-sectional views of sensor module 400. FIG. 6B shows a cross section that is parallel to a YZ plane. FIG. 6C shows a cross section that is parallel to the XY plane. FIG. 6D is a view showing sensor substrate 500.

Sensor module 400 includes sensor holder 401, sensor substrate 500 that is fixed to sensor holder 401, and current sensors 71, 72 and 73 that are mounted on sensor substrate 500. Current sensors 71, 72 and 73 are magnetic field type current sensors that measure a current flowing to power conversion circuit 2.

Sensor holder 401 is a part that is formed by insert-molding an insert nut including a female screw portion and a cylindrical member including a through-hole, and is made of a resin.

Sensor holder 401 includes sensor attachment portion 402 to which sensor substrate 500 is attached, attachment portions 403 (two portions) that are fixed to first substrate 100, attachment portions 404 (two portions) that are fixed to second substrate 200, and attachment portions 405 (two portions) that are fixed to shield plate 300.

Sensor attachment portion 402 is formed in a substantially frame shape. Sensor attachment portion 402 includes frame portion 402a and frame portion 402b that extend in the Y direction and are parallel to each other. Furthermore, sensor attachment portion 402 includes coupling frame portion 402c that couples one ends (+Y side ends) of frame portions 402a and 402b, and coupling frame portion 402d that couples other ends (+Y side ends) of frame portions 402a and 402b. Furthermore, sensor attachment portion 402 includes coupling portion 402e that couples intermediate portions of frame portions 402a and 402b.

Frame portions 402a and 402b, coupling frame portion 402c and coupling portion 402e form hole 406. Frame portions 402a and 402b, coupling frame portion 402d and coupling portion 402e form hole 407.

As shown in FIGS. 6B and 6C, sensor substrate 500 is a part that is attached to a lower surface of sensor attachment portion 402. More specifically, sensor substrate 500 is screwed to a plurality of portions of the lower surface of sensor attachment portion 402. Furthermore, sensor substrate 500 and second substrate 200 are electrically connected by using an unshown FFC and FFC connector, etc.

FIG. 6D shows a top view of sensor substrate 500. Sensor substrate 500 is a thin plate member that is formed in a substantially rectangular shape, and in which a wiring pattern is formed on the insulation plate that is the base.

Sensor substrate 500 includes frame portion 501 and frame portion 502 that extend in the Y direction and are parallel to each other.

Furthermore, sensor substrate 500 includes coupling frame portion 503 that couples one ends (+Y side ends) of frame portions 501 and 502, and coupling frame portion 504 that couples other ends (−Y side ends) of frame portions 501 and 502.

Furthermore, coupling portions 505, 506 and 507 that couple frame portion 501 and frame portion 502 are aligned from one end side (+Y side) to the other end side (−Y side) and formed between coupling frame portion 502 and coupling frame portion 504.

Frame portions 501 and 502, coupling frame portion 503 and coupling portion 505 form hole 508. Frame portions 501 and 502 and coupling portions 505 and 506 form hole 509. Frame portions 501 and 502 and coupling portions 506 and 507 form hole 510. Frame portions 501 and 502, coupling portion 507 and coupling frame portion 504 form hole 511.

Sensor 71 is mounted on a back surface of coupling frame portion 503. Sensor 72 is mounted on a back surface of coupling portion 506. Sensor 73 is mounted on a back surface of coupling frame portion 504.

Attachment portion 403 includes hole 403a that penetrates in the Z direction. Attachment portion 404 includes female screw portion 404a that extends in the −Z direction. Attachment portion 405 includes female screw portion 405a that extends in the −Z direction.

(Configurations of Fixing Portions A and Fixing Portion C)

Figure 7:
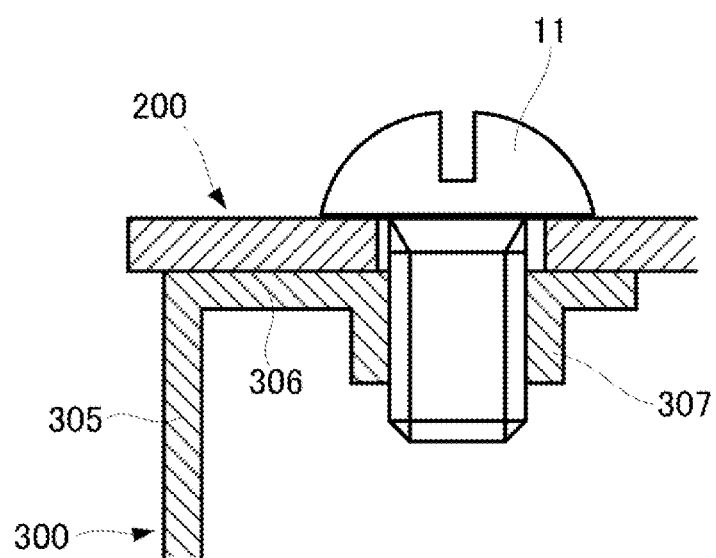
FIG. 7 is a cross-sectional view showing fixing portion A and fixing portion C.
Figure 7:
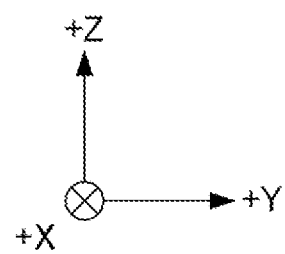

The configurations of fixing portions A and fixing portion C will be described with reference to FIG. 7. FIG. 7 is a cross-sectional view showing fixing portion A and fixing portion C. Hereinafter, only fixing performed by using screw 11 will be described, and fixing performed by using screw 12 or screw 13 is configured likewise and therefore description thereof will be omitted. FIG. 7 shows a cross section that is parallel to the YZ plane.

When second substrate 200 is mounted at fixing portion 306 that extends from the +Z end of wall portion 305 of shield plate 300 in the +Y direction, and screw 11 is screwed to screw hole 307 through hole 203, second substrate 200 is fixed to shield plate 300. In this case, second substrate 200 and shield plate 300 are mechanically connected and electrically connected.

(Configuration of Fixing Portions B)

Figure 8:
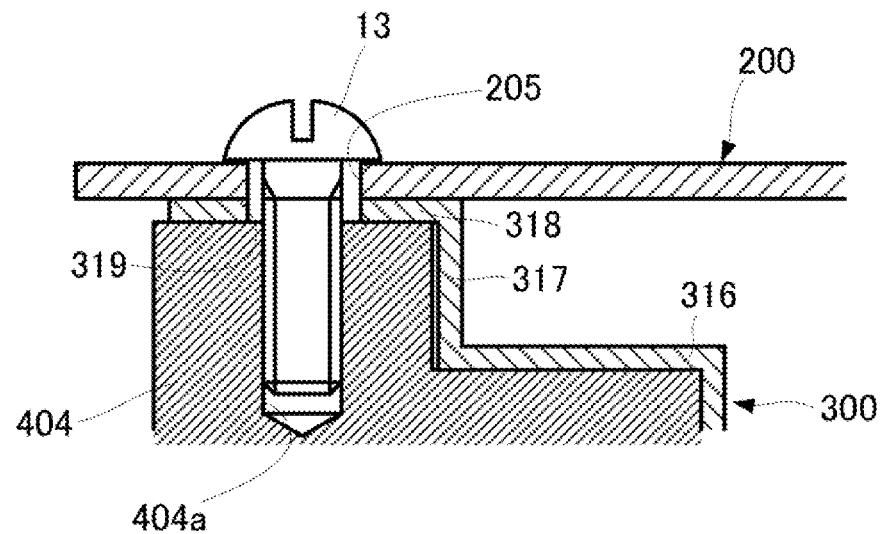
FIG. 8 is a cross-sectional view showing fixing portion B.

The configuration of fixing portions B will be described with reference to FIG. 8. FIG. 8 is a cross-sectional view of fixing portion B. Hereinafter, only fixing performed by using screw 13 will be described, and fixing performed by using screw 14 is configured likewise and therefore description thereof will be omitted. FIG. 8 shows a cross section that is parallel to the ZX plane.

Planar portion 318 of shield plate 300 and second substrate 200 are placed at attachment portion 404 of sensor holder 401. Furthermore, when screw 13 is screwed to female screw portion 404a through hole 205 and hole 319, second substrate 200 is fixed to shield plate 300 and sensor module 400. In this case, second substrate 200 and shield plate 300 are mechanically and electrically connected.

(Configuration of Fixing Portions D)

Figure 9:
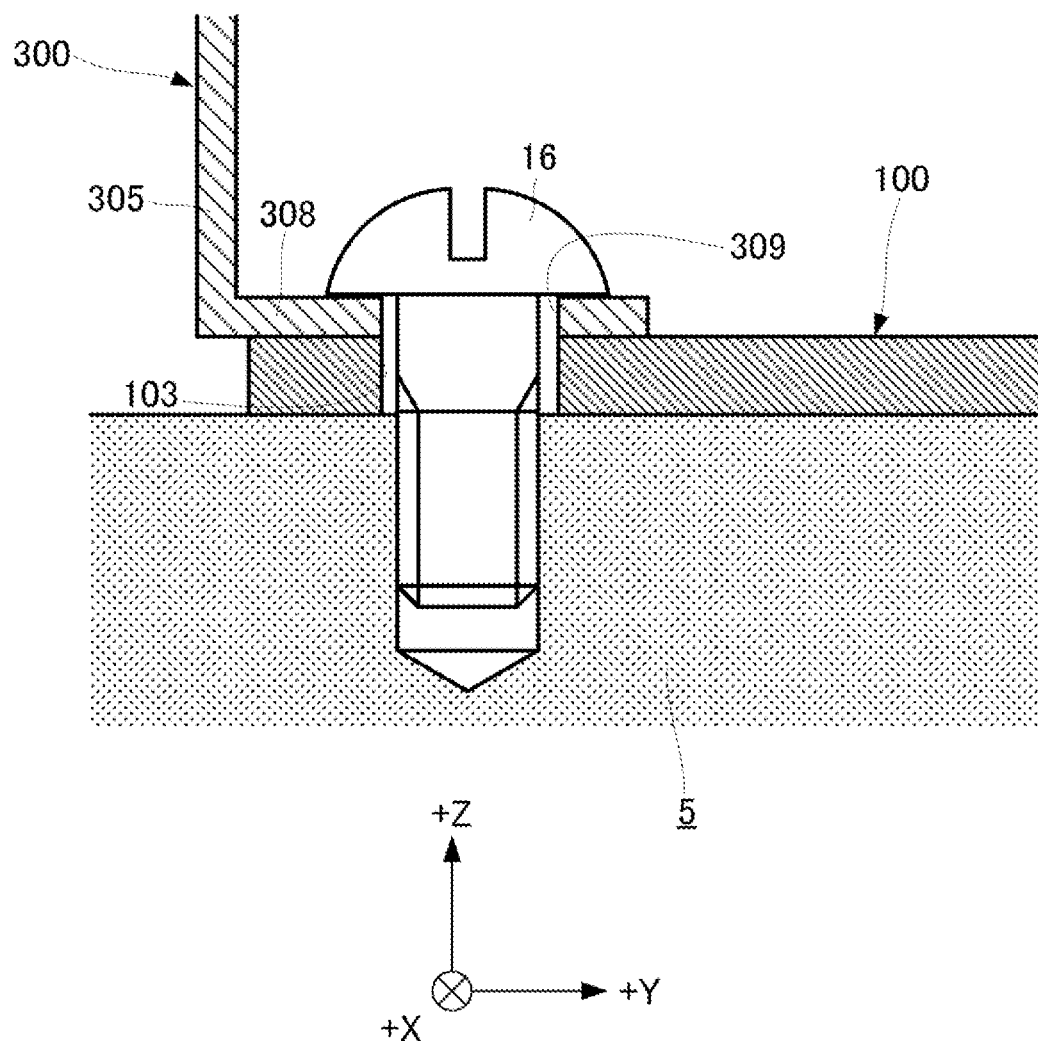
FIG. 9 is a cross-sectional view showing fixing portion D.

The configuration of fixing portions D will be described with reference to FIG. 9. FIG. 9 is a cross-sectional view of fixing portion D. Hereinafter, only fixing performed by using screw 16 will be described, and fixing performed by using screw 17 is configured likewise and therefore description thereof will be omitted. FIG. 9 shows a cross section that is parallel to the YZ plane.

Fixing portion 308 that extends from a −Z end of wall portion 305 of shield plate 300 in the +Y direction is placed on first substrate 100 placed in housing 5. Furthermore, when screw 16 is screwed to the female screw portion formed in housing 5 through hole 309 and hole 103, shield plate 300 is fixed to first substrate 100 and housing 5.

In this case, shield plate 300 is electrically connected with housing 5. Shield plate 300 is not electrically connected with first substrate 100. That is, second substrate 200 is electrically connected with housing 5 with shield plate 300 interposed therebetween. Thus, second substrate 200 is ground-connected.

As described above, in the present embodiment, first substrate 100 is ground-connected by using an unshown connector, and second substrate 200 is ground-connected with housing 5 with shield plate 300 interposed therebetween. This is for the following reason.

Currents flowing in control circuit 3 and electric power source circuit 4 mounted on second substrate 200 are relatively small. Hence, by ground-connecting second substrate 200 to housing 5 with shield plate 300 interposed therebetween, wiring for ground connection is omitted.

On the other hand, a current flowing in power conversion circuit 2 mounted on first substrate 100 is relatively large. Hence, by avoiding ground-connecting first substrate 100 to housing 5, an influence such as electromagnetic noise on control circuit 3 and electric power source circuit 4 is prevented.

(Configuration of Fixing Portions E)

Figure 10:
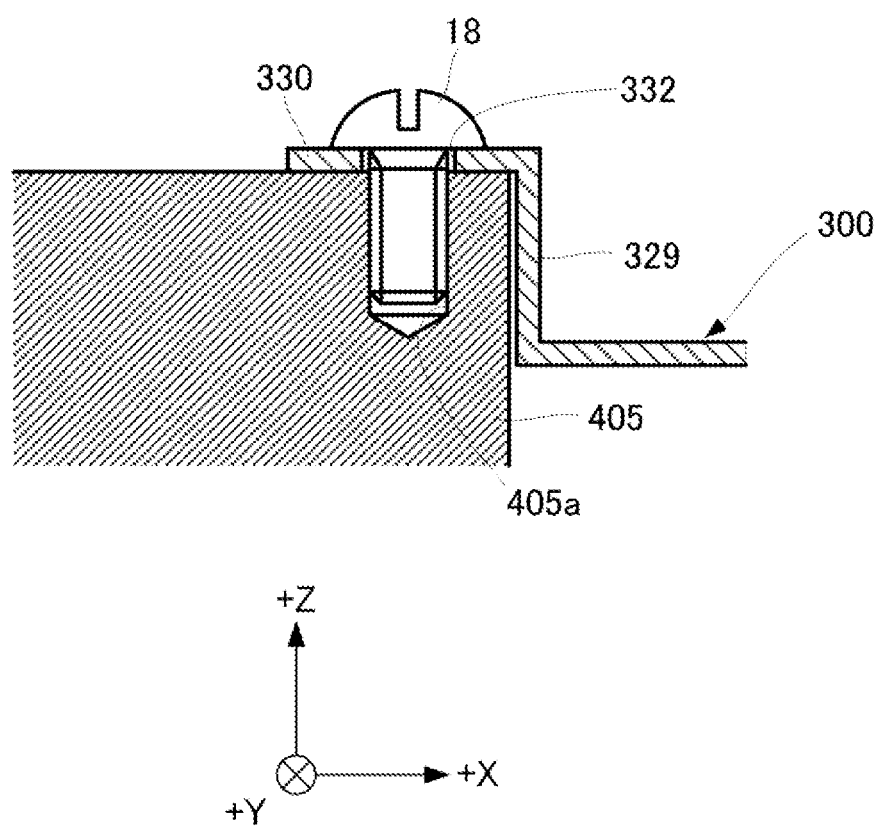
FIG. 10 is a cross-sectional view showing fixing portion E.

The configuration of fixing portions E will be described with reference to FIG. 10. FIG. 10 is a cross-sectional view of fixing portion E. Hereinafter, only fixing performed by using screw 18 will be described, and fixing performed by using screw 19 is configured likewise and therefore description thereof will be omitted. FIG. 10 shows a cross section that is parallel to the ZX plane.

When planar portion 330 of shield plate 300 is placed at attachment portion 405 of sensor holder 401, and screw 18 is screwed to female screw portion 405a through hole 332, shield plate 300 is fixed to sensor module 400.

(Configuration of Fixing Portions F)

Figure 11:
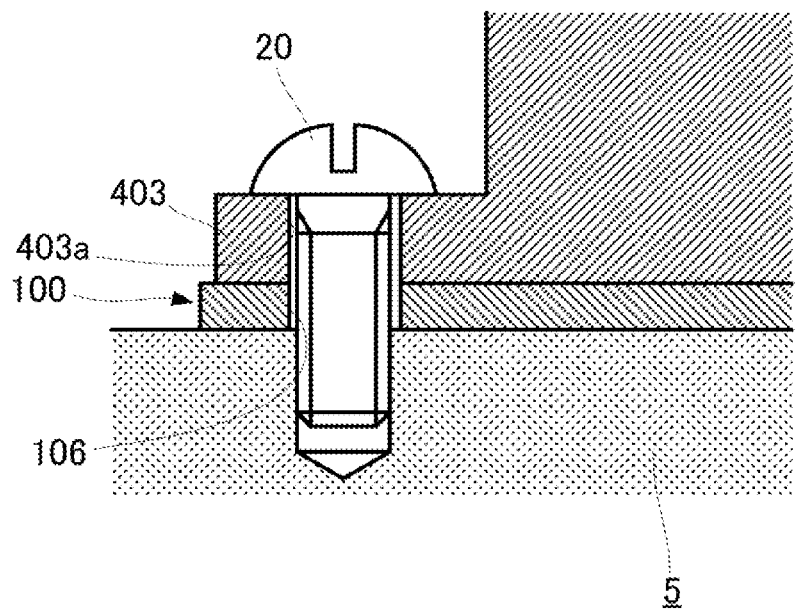
FIG. 11 is a cross-sectional view showing fixing portion F.
Figure 11:
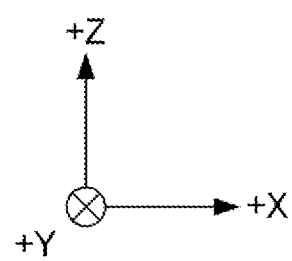

The configuration of fixing portions F will be described with reference to FIG. 11. FIG. 11 is a cross-sectional view of fixing portion F. Hereinafter, only fixing performed by using screw 20 will be described, and fixing performed by using screw 21 is configured likewise and therefore description thereof will be omitted. FIG. 11 shows a cross section that is parallel to the ZX plane.

Attachment portion 403 of sensor holder 401 is placed on first substrate 100 placed in housing 5. Furthermore, when screw 21 is screwed to the female screw portion formed in housing 5 through hole 403a and hole 106, sensor holder 401 is fixed to first substrate 100 and housing 5.

(Positional Relationship Between First Substrate 100, and Current Sensors 71, 72 and 73)

Figure 12A:
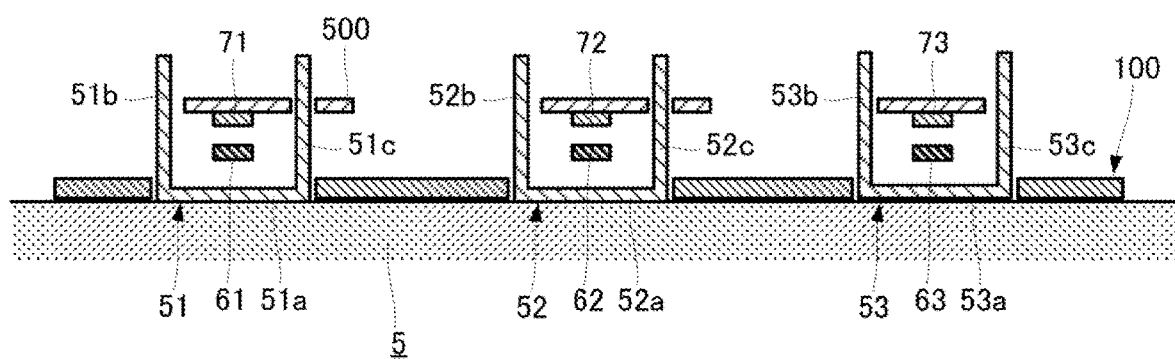
FIG. 12A is a view showing a positional relationship between the first substrate and a current sensor.
Figure 12A:
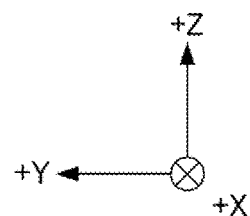
Figure 12B:
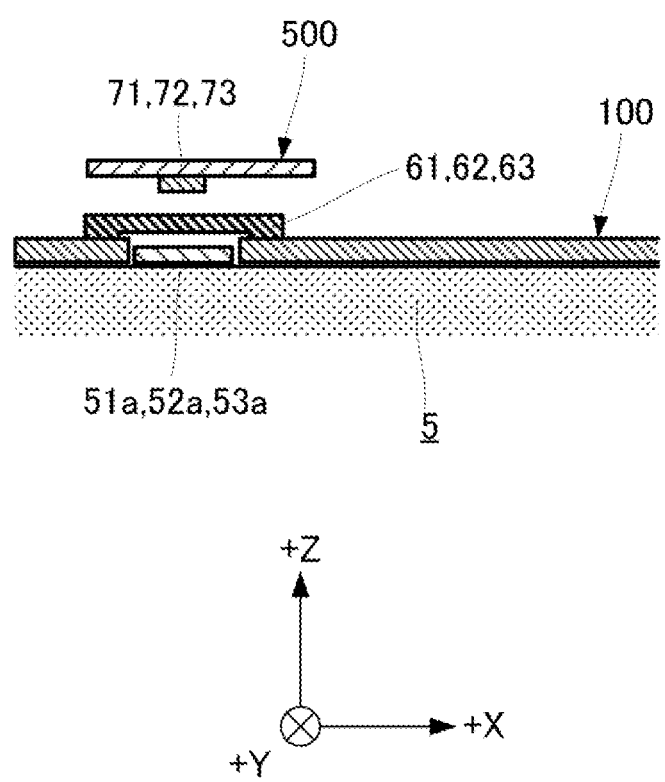
FIG. 12B is a view showing a positional relationship between the first substrate and the current sensors.

The positional relationship between first substrate 100 and current sensors 71, 72 and 73 will be described with reference to FIGS. 12A and 12B. FIGS. 12A and 12B show cross-sectional views showing the positional relationship between first substrate 100 and current sensors 71, 72 and 73. FIG. 12A shows a cross section that is parallel to the YZ plane. FIG. 12B shows a cross section that is parallel to the ZX plane.

As shown in FIG. 12A, magnetic elements 51, 52 and 53 are fixed to housing 5. Magnetic element 51 includes bottom portion 51a that is fixed to housing 5, and wall portions 51b and 51c that extend from both ends of bottom portion 51a to the +Z direction (upper direction). The same applies to magnetic elements 52 and 53, too.

Magnetic elements 51, 52 and 53 generate magnetic fields by currents flowing in current plates 61, 62 and 63. Current sensors 71, 72 and 73 respectively output current signals depending on magnitudes of the magnetic fields generated by magnetic elements 51, 52 and 53.

The current signals from current sensors 71, 72 and 73 are inputted to driving circuit 3 of second substrate 200 via the FFC connector. Driving circuit 3 performs various types of control based on an inputted current value.

Wall portion 51a of magnetic element 51 penetrates hole 107 of first substrate 100, passes on the +Y side of coupling frame portion 503 of sensor substrate 500, and reaches hole 406 of sensor holder 401. Wall portion 51b of magnetic element 51 penetrates hole 107 of first substrate 100 and hole 508 of sensor substrate 500, and reaches hole 406.

Wall portion 52a of magnetic element 52 penetrates hole 108 of first substrate 100 and hole 509 of sensor substrate 500, and reaches hole 406. Wall portion 52b of magnetic element 52 penetrates hole 108 of first substrate 100 and hole 510 of sensor substrate 500, and reaches hole 407.

Wall portion 53a of magnetic element 53 penetrates hole 109 of first substrate 100 and hole 511 of sensor substrate 500, and reaches hole 407. Wall portion 53b of magnetic element 53 penetrates hole 109 of first substrate 100, passes on the −Y side of coupling frame portion 504 of sensor substrate 500, and reaches hole 407.

As described above, current sensor 71 is mounted on the lower surface of coupling frame portion 503 of sensor substrate 500. That is, current sensor 71 is disposed between wall portions 51b and 51c of magnetic element 51. In other words, current sensor 71 is disposed right above magnetic element 51. In still other words, current sensor 71 is disposed overlapping magnetic element 51 in a thickness direction of first substrate 100. Current sensor 71 measures the current flowing in current plate 61 based on the magnetic field generated by magnetic element 51.

Current sensor 72 is mounted on a lower surface of coupling portion 506 of sensor substrate 500. That is, current sensor 72 is disposed between wall portions 52b and 52c of magnetic element 52. In other words, current sensor 72 is disposed right above magnetic element 52. In still other words, current sensor 72 is disposed overlapping magnetic element 52 in the thickness direction of first substrate 100. Current sensor 72 measures the current flowing in current plate 62 based on the magnetic field generated by magnetic element 52.

Current sensor 73 is mounted on a lower surface of coupling frame portion 504 of sensor substrate 500. That is, current sensor 73 is disposed between wall portions 53b and 53c of magnetic element 53. In other words, current sensor 73 is disposed right above magnetic element 53. In still other words, current sensor 73 is disposed overlapping magnetic element 53 in the thickness direction of first substrate 100. Current sensor 73 measures the current flowing in current plate 63 based on the magnetic field generated by magnetic element 53.

In addition, as described above, sensor holder 401 is a part made of a resin. Hence, sensor holder 401 hardly influences the magnetic fields generated by magnetic elements 51, 52 and 53. Consequently, it is possible to improve measurement precision of current sensors 71, 72 and 73.

From a viewpoint of the above heat capacity, it is preferable to widen the area of shield plate 300. However, when current sensors 71, 72 and 73 are directly disposed on shield plate 300, the magnetic fields generated by magnetic elements 51, 52 and 53 are disturbed, and measurement precision of current sensors 71, 72 and 73 lowers.

By contrast with this, according to the present embodiment, sensor holder 401 is provided adjacent to shield plate 300 to make it possible to widen the area of shield plate 300 and improve the measurement precision of current sensors 71, 72 and 73.

As described above, the power conversion apparatus according to the present embodiment includes: a first substrate on which power conversion circuits are mounted; a second substrate on which a driving circuit that drives the power conversion circuits is mounted; and a shield plate that is disposed between the first substrate and the second substrate, and the first substrate is a metal substrate.

Consequently, it is possible to improve cooling capability.

While various embodiments have been described herein above, it is to be appreciated that various changes in form and detail may be made without departing from the spirit and scope of the invention(s) presently or hereafter claimed.

This application is entitled to and claims the benefit of Japanese Patent Application No. 2018-060312, filed on Mar. 27, 2018, the disclosure of which including the specification, drawings and abstract is incorporated herein by reference in its entirety.

INDUSTRIAL APPLICABILITY

The power conversion apparatus according to the present disclosure can improve cooling capability, and is suitable for use in a vehicle.

REFERENCE SIGNS LIST

1 Power conversion apparatus
2 Power conversion circuit
3 Driving circuit
4 Electric power source circuit
5 Housing
6 Adhesive
11, 12, 13, 14, 15, 16, 17, 18, 19, 20, 21 Screw
51, 52, 53 Magnetic element
51a, 52a, 53a Bottom portion
51b, 51c, 52b, 52c, 53b, 53c Wall portion
61, 62, 63 Current plate
71, 72, 73 Current sensor
100 First substrate
101 Upper surface
102 Lower surface
103, 104, 105, 106, 107, 108, 109 Hole
200 Second substrate
201 Upper surface
202 Lower surface
203, 204, 205, 206, 207 Hole
300 Shield plate
301, 304, 316, 318, 321, 323, 330 Planar portion
303, 305, 310, 315, 317, 320, 322, 325, 329 Wall portion
301a, 301b, 301c, 306, 308, 311, 313, 326 Fixing portion
307, 312, 327 Screw hole
309, 314, 319, 324, 331, 332 Hole
333, 334 Rib
400 Sensor module
401 Sensor holder
402 Sensor attachment portion
402a, 402b Frame portion
402c, 402d Coupling frame portion
402e Coupling portion
403, 404, 405 Attachment portion
403a Hole
404a, 405a Female screw portion
406, 407 Hole
500 Sensor substrate
501, 502 Frame portion
503, 504 Coupling frame portion
505, 506, 507 Coupling portion
508, 509, 510, 511 Hole

The invention claimed is:

1. A power conversion apparatus, comprising:
a housing;
a first substrate having a first planar surface on which a power conversion circuit is mounted, the first substrate further including a first sidewall and second sidewall opposite to the first sidewall, a second planar surface opposite to the first planar surface, the second planar surface extends from the first sidewall to the second sidewall, the second planar surface in thermal contact with the housing;
a second substrate on which a driving circuit that drives the power conversion circuit is mounted, and the second substrate is electrically connected with the housing in which the first substrate is placed; and
a shield plate disposed between the first substrate and the second substrate, the shield plate is interposed between the second substrate and the housing, and
wherein the first substrate is a metal substrate.

2. The power conversion apparatus according to claim 1, wherein the shield plate is made of an iron-based material.

3. The power conversion apparatus according to claim 1, wherein a sensor holder is disposed adjacent to the shield plate in an extension direction of the shield plate.

4. The power conversion apparatus according to claim 3, wherein the sensor holder is provided with a magnetic field type current sensor that measures a current flowing to the power conversion circuit.

5. The power conversion apparatus according to claim 4, wherein the current sensor is disposed so as to overlap a magnetic element mounted in the housing, in a thickness direction of the first substrate.

6. The power conversion apparatus according to claim 1, wherein the shield plate includes a plurality of first fixing portions that are fixed to the second substrate, and a second fixing portion that is provided in a region surrounded by the plurality of first fixing portions and is fixed to the second substrate.

7. The power conversion apparatus according to claim 1, wherein the shield plate includes: a second substrate side fixing portion that extends in a first direction and is fixed to the second substrate; and a first substrate side fixing portion that extends in a direction different from the first direction and is fixed to the first substrate.

8. The power conversion apparatus according to claim 1, wherein a rim portion of the shield plate is provided with a rib.

9. The power conversion apparatus according to claim 1, wherein an adhesive having heat dissipation properties is provided between the first substrate and the shield plate.

10. The power conversion apparatus according to claim 1, wherein the driving circuits are mounted on both surfaces of the second substrate.

11. The power conversion apparatus according to claim 1, wherein the shield plate includes:
   a first planar portion that is disposed between a low height parts mounted on the first substrate and a high height parts mounted on the second substrate, and
   a second planar portion that is disposed between a high height parts mounted on the first substrate and a low height parts mounted on the second substrate.

12. The power conversion apparatus according to claim 1, wherein a semiconductor element of the power conversion circuit is formed as a chip part.

13. The power conversion apparatus according to claim 1, wherein a thermal grease is filled in a gap between a lower surface of the first substrate and the housing.

14. The power conversion apparatus according to claim 1, wherein the first substrate is electrically connected with the housing via a connector.

15. The power conversion apparatus according to claim 3, wherein the sensor holder is a part made of a resin.

16. The power conversion apparatus according to claim 1, wherein the shield plate is positioned between a first surface of the driving circuit facing towards a second surface of the power conversion circuit facing towards the driving circuit, the shield plate separating the first surface from the second surface.

17. A power conversion apparatus, comprising:
   a housing;
   a first substrate having a first planar surface on which a power conversion circuit is mounted, the first substrate further including a first sidewall and second sidewall opposite to the first sidewall, a second planar surface opposite to the first planar surface, the second planar surface extends from the first sidewall to the second sidewall, the second planar surface in thermal contact with the housing;
   a second substrate on which a driving circuit that drives the power conversion circuit is mounted, and the second substrate is electrically connected with the housing in which the first substrate is placed;
   a shield plate disposed between the first substrate and the second substrate, the shield plate is interposed between the second substrate and the housing; and
   a plurality of fasteners coupling together the first substrate, the second substrate, the shield plate, and the housing.

18. A power conversion apparatus comprising:
   a first substrate;
   a power conversion circuit mounted on the first substrate, the power conversion circuit including a first surface facing away from the first substrate;
   a second substrate on which a driving circuit that drives the power conversion circuit is mounted, the driving circuit including a second surface facing away from the second substrate and towards the first surface; and
   a shield plate disposed between the power conversion circuit and the driving circuit, the shield plate separates the first surface of the power conversion circuit from the second surface of the driving circuit.

19. The power conversion apparatus according to claim 18, further comprising:
   a first compartment between the shield plate and the first substrate in which the power conversion circuit is disposed; and
   a second compartment between the shield plate and the second substrate in which the driving circuit is disposed.

* * * * *